United States Patent
Nieh et al.

(10) Patent No.: US 8,043,884 B1
(45) Date of Patent: Oct. 25, 2011

(54) METHODS OF SEAMLESS GAP FILLING

(75) Inventors: Shin-Yu Nieh, Taoyuan County (TW);
 Shuo-Che Chang, Taoyuan County
 (TW); Hui-Lan Chang, Taoyuan County
 (TW); Cheng-Shun Chen, Taoyuan
 County (TW)

(73) Assignee: Nanya Technology Corporation,
 Taoyuan (TW)

( * ) Notice: Subject to any disclaimer, the term of this
 patent is extended or adjusted under 35
 U.S.C. 154(b) by 0 days.

(21) Appl. No.: 12/786,249

(22) Filed: May 24, 2010

(51) Int. Cl.
 *H01L 21/00* (2006.01)
(52) U.S. Cl. .......................................... 438/73
(58) Field of Classification Search .................. None
 See application file for complete search history.

(56) References Cited

U.S. PATENT DOCUMENTS

| | | | |
|---|---|---|---|
| 2004/0188737 A1* | 9/2004 | Chaudhry et al. | 257/296 |
| 2005/0282393 A1* | 12/2005 | Cheng et al. | 438/700 |
| 2008/0102557 A1* | 5/2008 | Kim et al. | 438/73 |
| 2009/0236691 A1* | 9/2009 | Dyer et al. | 257/532 |

* cited by examiner

*Primary Examiner* — Walter L Lindsay, Jr.
*Assistant Examiner* — Andre' C Stevenson

(57) ABSTRACT

A method for seamless gap filling is provided, including providing a semiconductor structure with a device layer having a gap therein, wherein the gap has an aspect ratio greater than 4. A liner layer is formed over the device layer exposed by the gap. A first un-doped oxide layer is formed over the liner layer in the gap. A doped oxide layer is formed over the first undoped oxide layer in the gap. A second un-doped oxide layer is formed over the doped oxide layer in the gap to fill the gap. An annealing process is performed on the second un-doped oxide layer, the doped oxide layer, and the first un-doped oxide to form a seamless oxide layer in the gap, wherein the seamless oxide layer has an interior doped region.

16 Claims, 6 Drawing Sheets

US 8,043,884 B1

METHODS OF SEAMLESS GAP FILLING

BACKGROUND OF THE INVENTION

1. Field of the Invention

The present invention relates to semiconductor processing, and in particular, to methods for seamlessly filling gaps with high aspect ratio and a semiconductor device having seamless isolation structures therein.

2. Description of the Related Art

Typically, it is necessary in semiconductor processing to fill a high aspect ratio gap with insulating material. For example, like filling an inter-metal dielectric (IMD), inter-layer dielectric (ILD), pre-metal dielectric (PMD), and shallow trench isolation (STI) gap with un-doped oxide materials. As device dimensions shrink and thermal budgets are reduced, the seamless filling of high aspect ratio (AR) spaces (e.g., AR>4:1) has become increasingly difficult due to existing deposition process limitations. Currently, the method used for high aspect ratio (AR) gap-fill is deposition of an undoped oxide layer. Also, high density plasma chemical vapor deposition (HDP CVD) is used and a directional (bottom-up) CVD process.

Evolving semiconductor device designs and dramatically reduced feature sizes have resulted in several situations where HDP processes using current technologies may not be able to sufficiently fill high aspect ratio structures (e.g., AR>7:1). Therefore, an alternative to using CVD is atomic layer deposition (ALD). Adsorption of reactant gases are limited when using ALD and thin, conformal dielectric films with high aspect ratio features may be formed.

However, for sub 40 nm node technology, structures such as gaps or trenches with aspect ratios greater than 10:1 may be formed in a semiconductor device, and an undesired seam may be formed following gap-fill or filling of a trench using the ALD process. Thus, seamless gap filling is desired.

BRIEF SUMMARY OF THE INVENTION

Accordingly, methods of seamless gap filling are provided to fill semiconductor structures having gaps or trenches with an aspect ratio greater than 4:1 and preferably greater than 10:1. Seamless shallow trench isolation (STI) structures and fabrication methods thereof based on the above method of seamless gap filling are also provided.

An exemplary method of seamless gap filling comprises providing a semiconductor structure with a device layer having a gap therein, wherein the gap has an aspect ratio greater than 4. A liner layer is formed over the device layer exposed by the gap. A first un-doped oxide layer is formed over the liner layer in the gap. A doped oxide layer is formed over the first undoped oxide layer in the gap. A second un-doped oxide layer is formed over the doped oxide layer in the gap to fill the gap. An annealing process is performed on the second un-doped oxide layer, the doped oxide layer, and the first un-doped oxide to form a seamless oxide layer in the gap, wherein the seamless oxide layer has an interior doped region.

An exemplary method of forming a shallow trench isolation structure comprises providing a semiconductor substrate, a pad layer over the semiconductor substrate, and a trench formed in the pad layer and the semiconductor trench, wherein the trench has an aspect ratio greater than 10. A liner layer is formed over the semiconductor substrate and the pad layer exposed by the trench. A first un-doped oxide layer is formed over the liner layer in the trench. A doped oxide layer is formed over the first undoped oxide layer in the trench. A second un-doped oxide layer is formed over the doped oxide layer in the trench to fill the trench. An annealing process is performed on the second un-doped oxide layer, the doped oxide layer, and the first un-doped oxide, to form a seamless oxide layer in the trench, wherein the seamless oxide layer has an interior doped region.

An exemplary semiconductor device, comprises a semiconductor substrate with a trench therein, a liner layer formed over a sidewall of the semiconductor substrate exposed by the trench, a seamless oxide layer comprising an N-type or P-type doped region partially filling the trench, and a cap oxide layer formed over the seamless oxide layer, filling the trench, wherein the cap oxide layer physically contacts the N-type or P-type doped region of the seamless oxide layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-7 are schematic diagrams showing an exemplary method of seamless gap filling.

Figure 1:
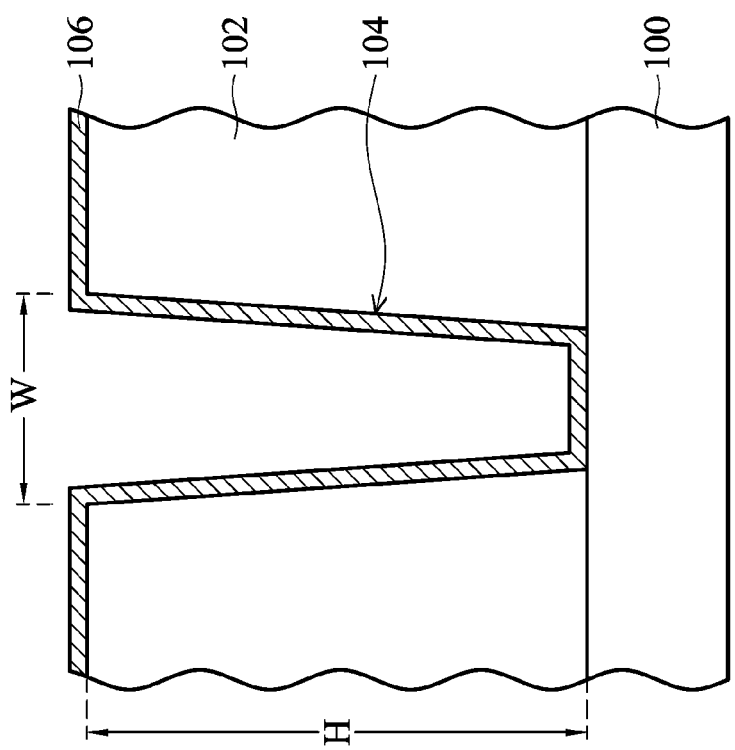

In FIG. 1, a semiconductor device with an integrated circuit (IC) structure 100 having a device layer 102 formed thereover is provided, and the device layer 102 is formed with a gap 104 therein, partially exposes a portion of the IC structure 100. The IC structure 100 may comprise a semiconductor substrate (not shown) having semiconductor components and multilayer interconnection structures formed thereon or merely a semiconductor substrate with stacked dielectric layers thereon. The semiconductor components may be either active or passive components formed on a semiconductor substrate, and the multi-layer interconnection structures may be multiple metallization layers supported and spaced by inter-layer dielectric materials. The semiconductor components and multi-layer interconnection structures that may be formed, however, are not shown in the IC structure 100 for simplicity. The device layer 102 can be, for example, a dielectric layer for functioning as an ILD, IMD, or PMD layer, or a conductive layer for functioning as conductive elements such as conductive lines or vias which are made of conductive materials such as metal or doped-polysilicon. In one embodiment, the gap 104 may have an aspect ratio (i.e. the ratio of a gap depth H to a gape width W; H/W) greater than 4, and may have an even greater aspect ratio of about 10~40 when applied using sub 40 nm node technology. Next, a liner layer 106 is conformably deposited, covering a top surface of the device layer 102 and sidewall surfaces of the device layer 102 exposed by the gap 104. The liner layer 106 may comprise dielectric materials such as silicon nitride or silicon oxide, having a thickness of about 10-120 Å, and the liner layer 106 can be formed by, for example, a chemical vapor deposition process, a nitridation process for forming the silicon nitride or a thermal growth process or a radical oxidation process for forming silicon oxide.

Figure 2:
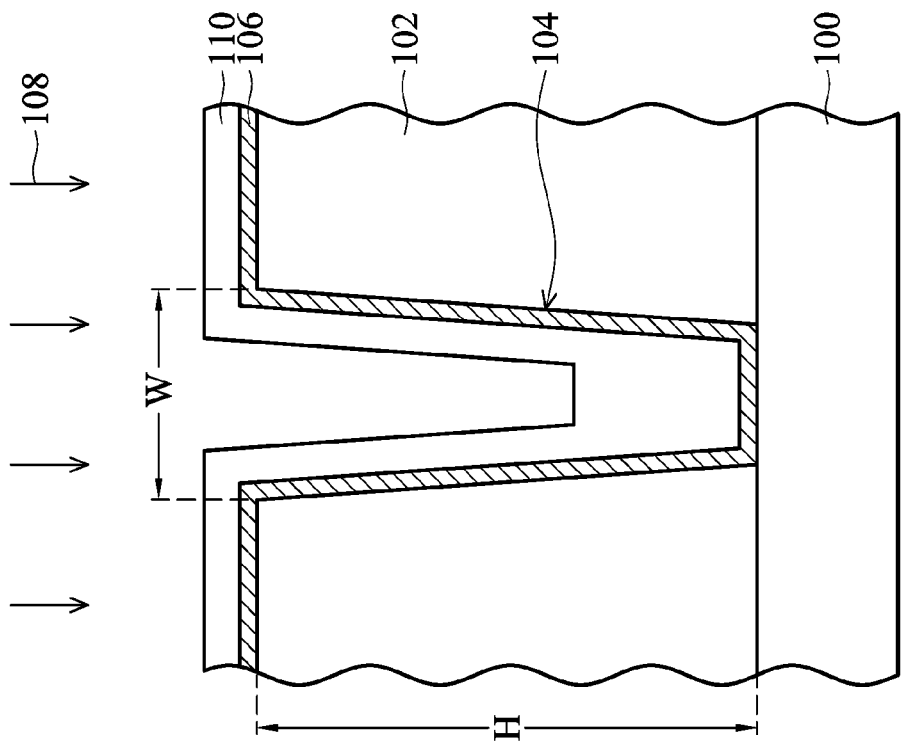
FIGS. 1-7 are schematic diagrams showing a method of seamless gap filling according to an embodiment of the invention.

In FIG. 2, a process 108 is performed to form a conformal un-doped oxide layer 110 over the structure illustrated in FIG. 1, covering a top surface of the liner layer 106 and partially filling the gap 104. The process 108 can be, for example, a chemical vapor deposition (CVD), high density plasma chemical vapor deposition (HDP CVD), or atomic layer deposition (ALD) process depending on the aspect ratio of the gap 104. The un-doped oxide layer 110 is conformably formed over the liner layer 106 disposed over the device layer 102 and sidewall surfaces of the liner layer exposed by the gap 104. The un-doped oxide layer 110 may comprise silicon dioxide and has a thickness of about 50-200 Å. In one embodiment, the gap 104 has an aspect ratio greater than 10:1, and the process 108 is preferably an ALD process, and the un-doped oxide layer 110 is preferably a silicon oxide layer formed by using precursors comprising tris(dimethylamino)silane (3DMAS), bisdiethylaminosilane (BDEAS) or bis(tertiary-butylamino)silane (BTBAS), and oxidizer comprising ozone ($O_3$), oxygen ($O_2$) or hydrogen oxide ($H_2O$) for 10-500 deposition cycles.

Figure 3:
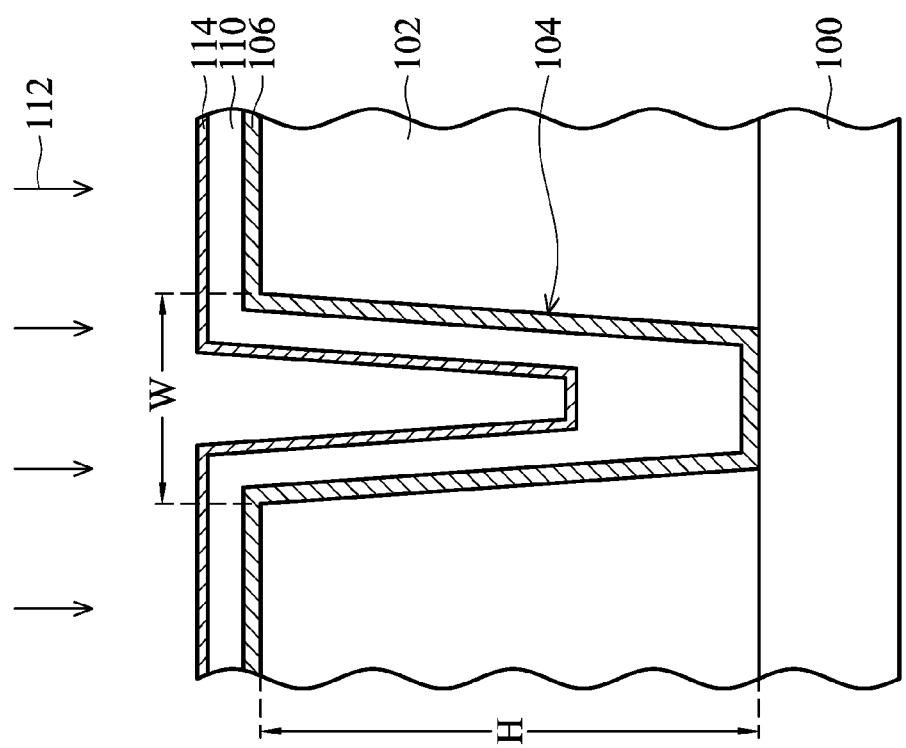

In FIG. 3, a process 112 is performed to form a conformal doped oxide layer 114 over the structure illustrated in FIG. 2, covering a top surface of the un-doped oxide layer 106 and partially filling the gap 104. The process 112 can be, for example, a CVD, HDP CVD, or ALD process incorporating N-type or P-type doping reactants or precursors, and the doped oxide layer 114 is conformably formed over the undoped oxide layer 110 and may comprise N-type or P-type doped silicon oxides, boron-silicate glass (BSG), phosphosilicate glass (PSG), or boronphosphosilicate glass (BPSG), having a thickness of about 5-20 Å. In one embodiment, the gap 104 has an aspect ratio greater than 10:1, the process 112 is preferably an ALD process, and the doped oxide layer 114 is preferably a doped silicon oxide layer formed by precursors comprising tris(dimethylamino)silane (3DMAS), bisdiethylaminosilane (BDEAS), bis(tertiary-butylamino)silane (BTBAS) and oxidizer comprising ozone ($O_3$), oxygen ($O_2$) or hydrogen oxide ($H_2O$) for 2~5 deposition cycles. Suitable reactants or precursors for providing N-type or P-type atoms used in the process 112 may comprise phosphorus ($PH_3$), trimethylphosphine (TMP), triethylphosphate (TEPO), $P(NMe_2)_3$, diborane ($B_2H6$), triethyoborane (TEB), or trimethylborate (TMB).

Figure 4:
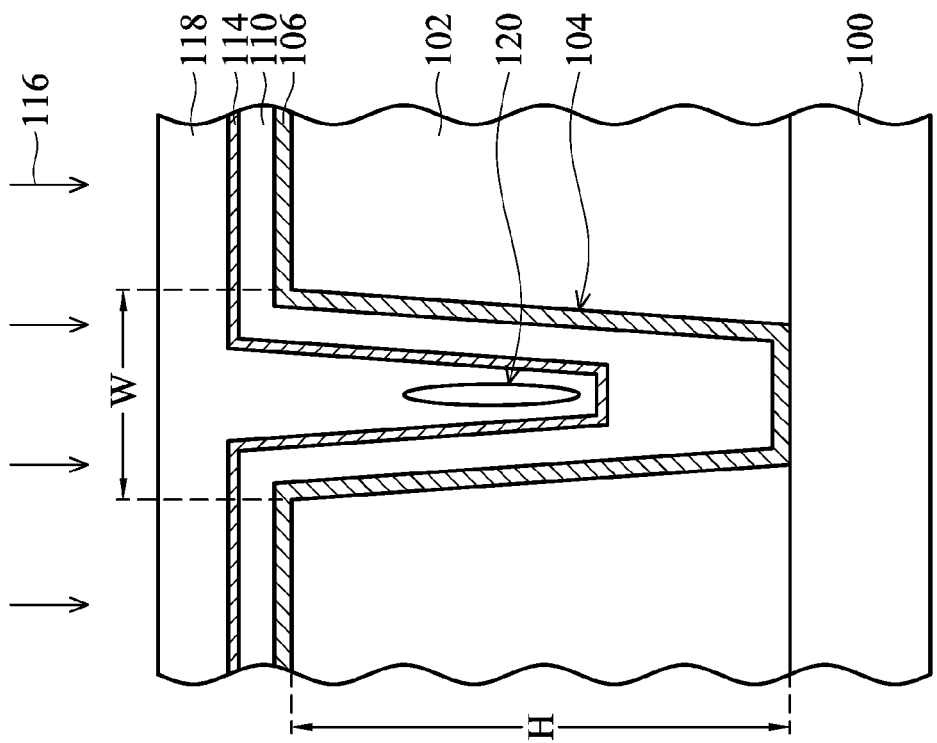

In FIG. 4, a process 116 is performed to form an undoped oxide layer 118 over the structure illustrated in FIG. 3, covering a top surface of the doped oxide layer 114 and entirely filling the gap 104. The process 116 can be, for example, a CVD, HDP CVD, or ALD process. The un-doped oxide layer 118, formed over the doped oxide layer 114, may comprise silicon dioxide, having an overall thickness raging from 100 Å to 2000 Å. In one embodiment, the gap 104 is formed with an aspect ratio greater than 10:1, and the process 116 is preferably an ALD process, and the un-doped oxide layer 118 is preferably a silicon oxide layer formed by precursors comprising 3DMAS, BDEAS or BTBAS_and oxidizers comprising $O_3$, $O_2$ or $H_2O$ for 10-500 cycles. As shown in FIG. 4, although the gap 104 is entirely filled after formation of the undoped oxide layer 118, however, an undesired seam 120 may exist in the un-doped oxide layer 120 near a center position of the gap 104.

Figure 5:
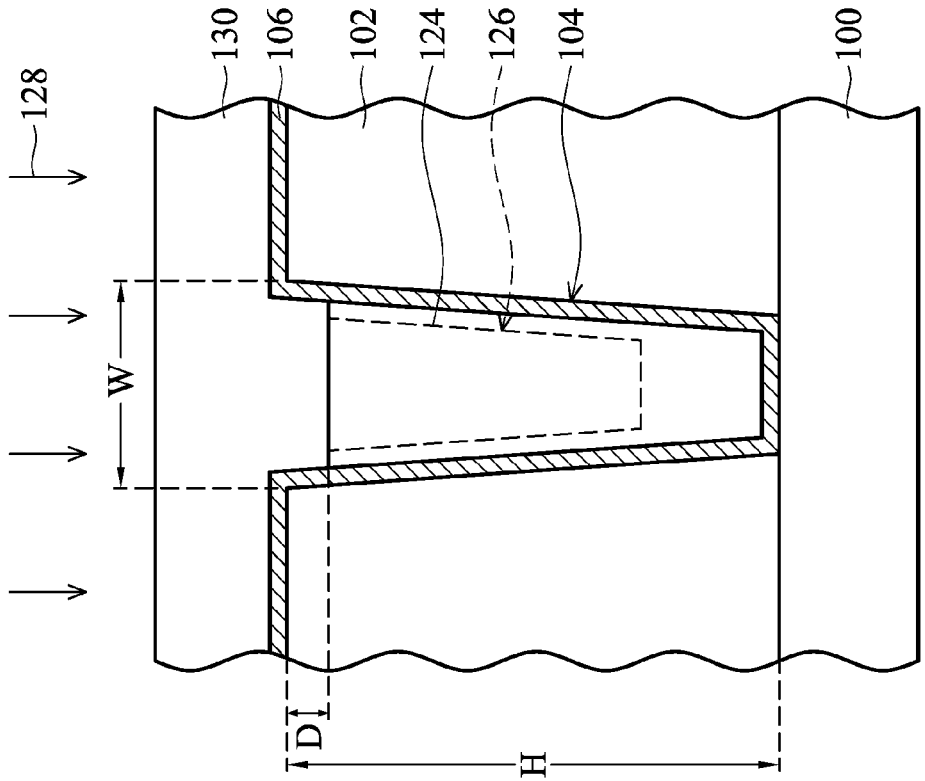

Therefore, for the purpose of eliminating the undesired seam 120 in the gap filling, an anneal process 122 is performed on the structure illustrated in FIG. 4 to thereby eliminate the undesired seam 120 and provide seamless filling of the gap 104, as shown in FIG. 5. The annealing process 122 can be a furnace annealing process or a rapid thermal annealing (RTA) process performed under an ambient comprising nitrogen ($N_2$), argon (Ar), or steam, and at a temperature of about 600~850° C. for about 30~600 seconds. In the annealing process 122, dopants in the N-type or P-type doped oxide layer 114 are diffused toward the undoped oxide layers 110 and 118 adjacent thereto, and a film stack comprising the seam 120 in the gap 104 may be reformed as a seamless oxide layer 124 with a doped region 126 with either N-type or P-type dopants therein. The other region of the seamless oxide layer 124 rather than the doped region 126 may still comprise undoped oxide materials. In one embodiment, the doped region 126 may have an N-type or P-type doping concentration of about $10^{19}$~$10^{23}$ atoms/cm$^3$ and the seamless oxide layer 124 may function as an electrically insulating layer.

Figure 6:
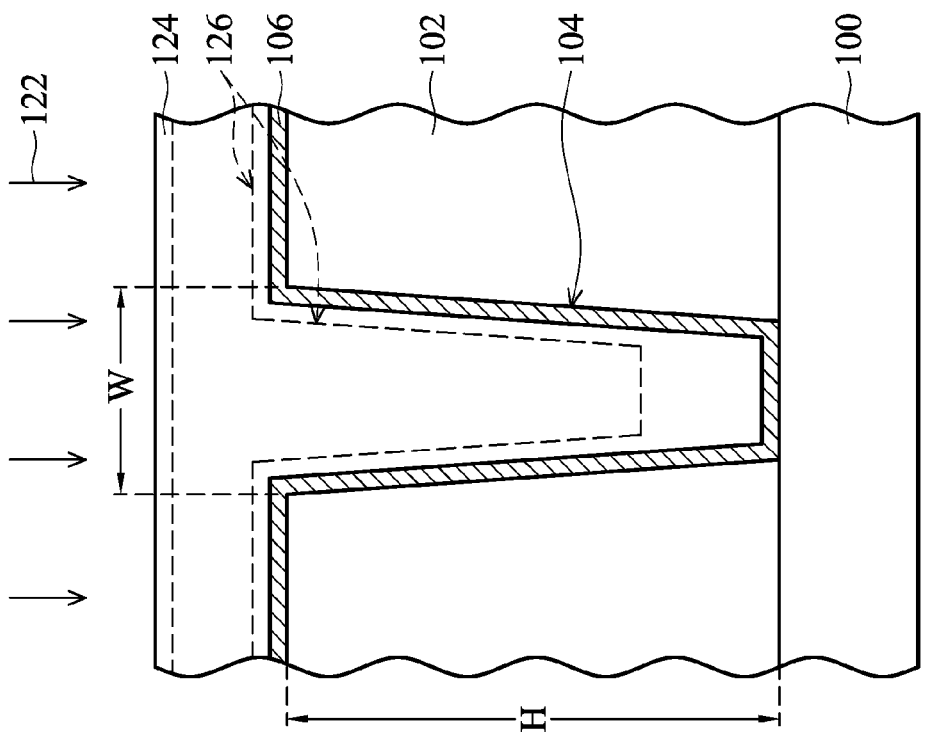

As shown in FIG. 5, the seamless oxide layer 124 with an interior doping region 126, however, is structurally softer than an undoped oxide layer such that the seamless oxide layer 124 may be easily removed during sequential etching (not shown) processes. Namely, a corner portion near the device layer 102 may not be properly protected by the seamless oxide layer 124 during sequential processing steps. Therefore, as shown in FIG. 6, an etching process (not shown) such as a dry etching process is performed on the structure illustrated in FIG. 5 to entirely remove the seamless oxide layer 124 above the liner layer 106 and partially remove a portion of the seamless oxide layer 124 in the gap 104, thereby exposing a top surface of a portion of the seamless oxide layer 126 having a distance D of about 100~500 Å to a top surface of the device layer 102. A process 128 is next performed to form a cap oxide layer 130 over the seamless oxide layer 124 and the liner layer 106. The cap oxide layer 130 fills the gap 104 without forming any seam therein. The process 128 can be, for example, an HDP CVD, plasma enhanced chemical vapor deposition (PECVD) process, or spin on glass (SOG) process, and the cap oxide layer 130 may comprise un-doped oxide or silica glass.

Figure 7:
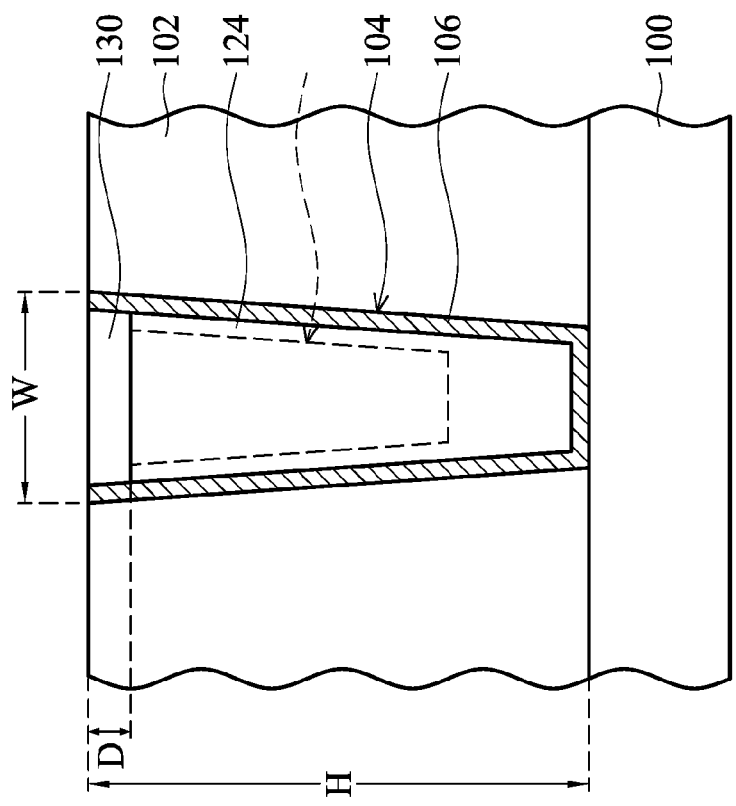

In FIG. 7, for the purpose of providing easy sequential processing steps, the portion of the liner layer 106 and the cap oxide layer 130 above the device layer 102 can be removed by methods such an etching or chemical mechanical polishing (CMP) method, such that the device layer 102 is provided with a planar top surface and seamless gap filling to provide reliable isolation or insulation therein. The seamless gap filling comprises the cap oxide layer 130 and the seamless oxide layer 124 having N-type or P-type doped region 126 surrounded by the liner layer 106. In one embodiment, a distance between a bottom surface of the gap 104 and the N-type or P-type doped region 126 of the seamless oxide layer 124 may be greater than one third of a depth of the gap 104.

The above method of seamless gap filling is not limited to formation of a seamless gap filling in a device layer as that illustrated in FIGS. 1-7. FIGS. 8-12 are schematic diagrams showing an exemplary method of fabricating a semiconductor device with a shallow trench isolation (STI) structure based on the above method of seamless gap filling.

Figure 8:
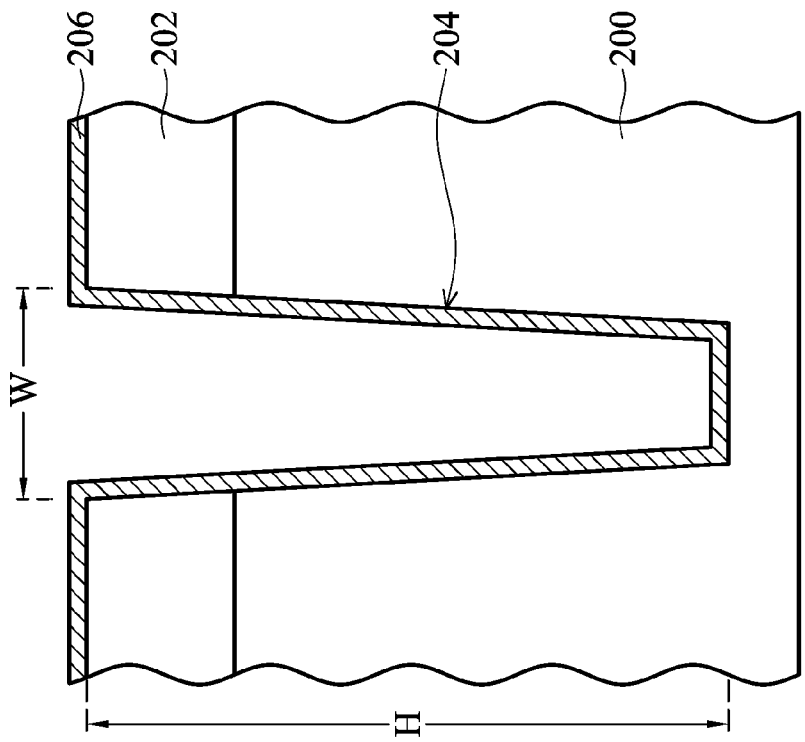
FIGS. 8-12 are schematic diagrams showing a method of fabricating a semiconductor device with a seamless shallow trench isolation (STI) structure according to an embodiment of the invention.

In FIG. 8, a semiconductor substrate 200 with a pad layer 202 formed thereon is provided. A trench 204 formed through the semiconductor substrate 200 and the pad layer 202 is also provided. The semiconductor substrate 200 may comprise semiconductor materials such as silicon, silicon germanium, or the like, and the pad layer 202 may be a composite layer comprising an underlying oxide layer and an overlying nitride layer. For the purpose of simplicity, a single pad layer 202 is illustrated. The trench 204 may have an aspect ratio (i.e. the ratio of a trench depth H to a trench width W; H/W) greater than 10, and may have an even greater aspect ratio of about 10~40 when applied using sub 40 nm node technology. Next, a liner layer 206 is conformably deposited, covering a top surface of the pad layer 202 and sidewall surfaces of the pad layer 102 and the semiconductor substrate 200 exposed by the trench 204. The liner layer 206 may comprise dielectric materials such as silicon nitride or silicon oxide, having a thickness of about 10~120 Å. The liner layer 206 can be formed by, for example, a chemical vapor deposition process, a nitridation process for forming silicon nitride, or a thermal growth process or a radical oxidation process for forming silicon oxide.

Figure 9:
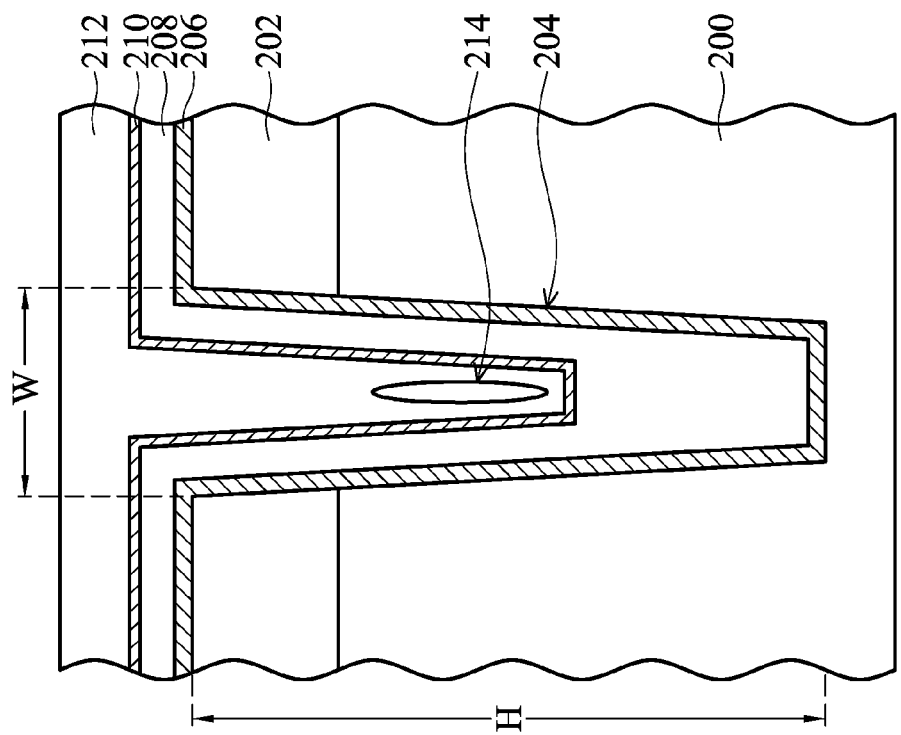

In FIG. 9, processes similar with the processes 108, 112, and 116 shown in FIGS. 2-4 are then performed to sequentially form an undoped oxide layer 208, a doped oxide layer 210, and an undoped oxide layer 212 over the liner layer 206. The undoped oxide layer 208, the doped oxide layer 210, and the undoped oxide layer 212 fill the trench 204, but an undesired seam 214 may be formed in the undoped oxide layer 212 at a place near a center of the trench 204.

Figure 10:
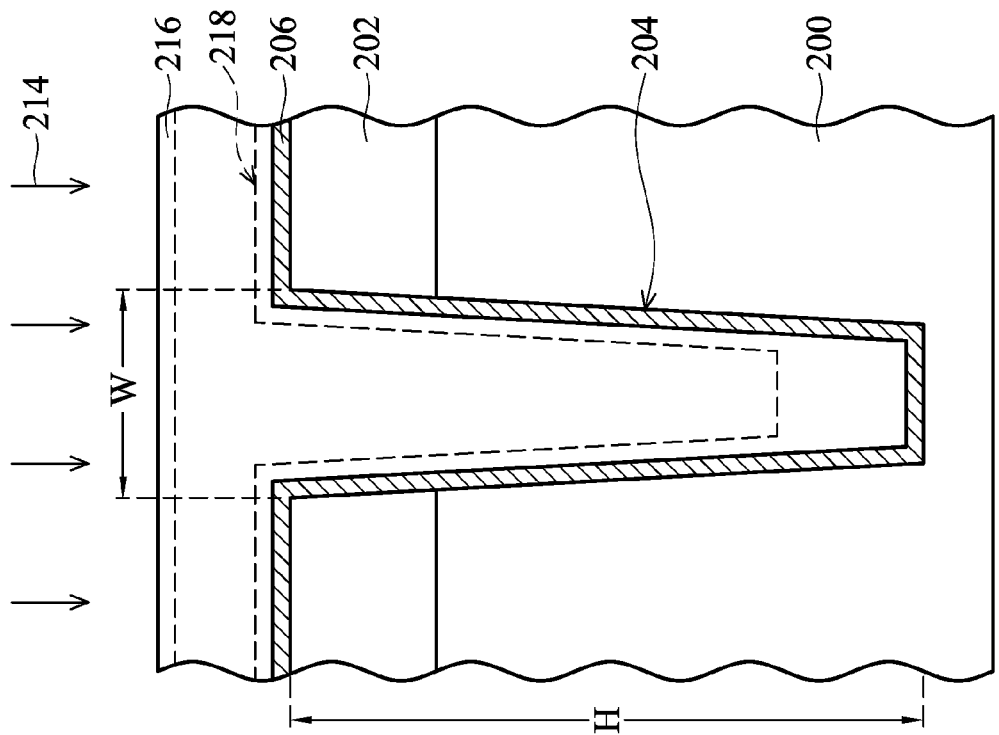

In FIG. 10, an anneal process 214 similar with the annealing process 122 shown in FIG. 5 is performed on the structure illustrated in FIG. 9 for the purpose of eliminating the undesired seam 214 and providing seamless filling in the trench 204. In the annealing process 214, the N-type or P-type atoms in the doped oxide layer 210 are diffused toward the un-doped oxide layers 208 and 212 adjacent thereto, and a film stack comprising the seam 214 in the trench 204 may be reformed as a seamless oxide layer 216 with a doped region 218 with either N-type or P-type dopants therein. The other region of the seamless oxide layer 214 rather than the doped region 218 may comprise undoped oxide materials. In one embodiment, the doped region may have an N-type or P-type doping concentration of about $10^{19}$~$10^{23}$ atoms/cm$^3$ and the seamless oxide layer 216 may function as an electrically insulating layer.

Figure 11:
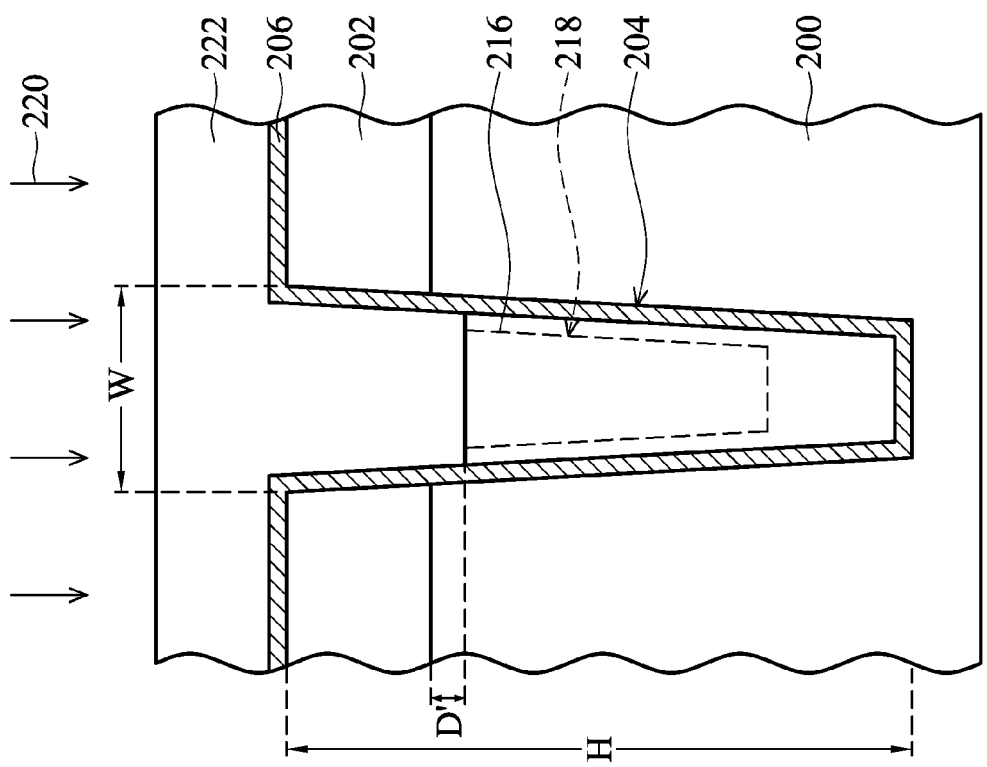

As shown in FIG. 10, the seamless oxide layer 216 with an interior doping region 218, however, is structurally softer than an undoped oxide layer such that the seamless oxide layer 216 may be easily removed during a sequential etching (not shown) process. Namely, a corner portion near the semiconductor substrate 200 may not be properly protected by the seamless oxide layer 216 during sequential processing steps. Therefore, as shown in FIG. 11, an etching process (not shown) such as a dry etching process is performed on the structure illustrated in FIG. 10 to entirely remove the seamless oxide layer 216 above the liner layer 206 and partially remove a portion of the seamless oxide layer 216 in the trench 204, thereby exposing a top surface of a portion of the seamless oxide layer 216 having a distance D' of about 100~500 Å to a top surface of the semiconductor substrate 200. A process 220 is next performed to form a cap oxide layer 222 over the seamless oxide layer 216 and the liner layer 206. The cap oxide layer 222 fills the trench 204 without forming any seam therein. The process 220 can be, for example, an HDP CVD, plasma enhanced chemical vapor deposition (PECVD) process, or spin on glass (SOG) process, and the cap oxide layer 222 may comprise un-doped oxide or silica glass.

Figure 12:
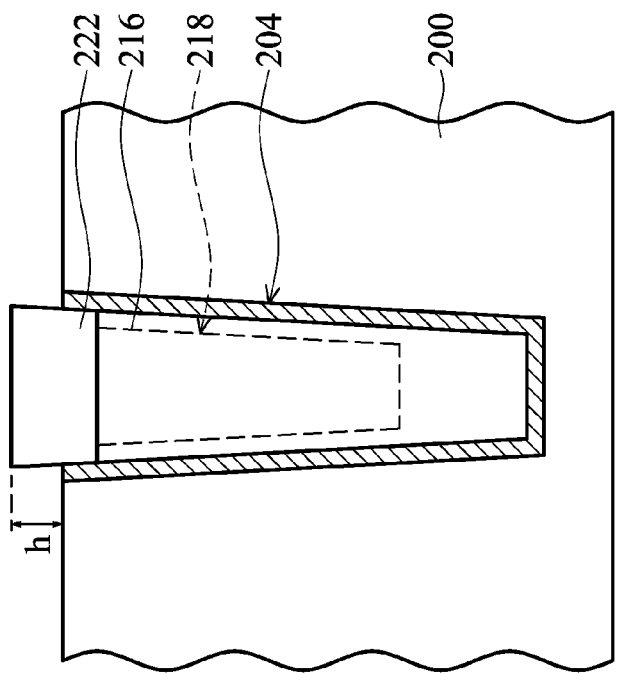

In FIG. 12, the portion of the liner layer 206, the cap oxide layer 222, and the pad layer 202 above the semiconductor substrate 200 can be sequentially removed by methods such as an etching method, so that the trench 204 shown in FIG. 11 is formed into a trench 204' with a reduced height and may have a reduced aspect ratio of about 10~20. A seamless filling comprising the cap oxide layer 222 and the seamless oxide layer 216 surrounded by the liner layer 206 is thus left in the trench 204' for functioning as a shallow trench isolation structure for defining, for example, active areas in the semiconductor substrate 200. In one embodiment, the cap oxide layer 222 partially protrudes over a top surface of the semiconductor substrate 200 and has a distance h less than 150 Å, preferably of about 0~100 Å to the top surface of the semiconductor substrate 200. In another embodiment, a distance between a bottom surface of the trench 204' and the N-type or P-type doped region 218 of the seamless oxide layer 216 may be greater than one third of a depth of the trench 204'.

As shown in FIG. 12, a semiconductor device with an exemplary seamless shallow trench isolation structure is provided, comprising: a semiconductor substrate (e.g. the semiconductor substrate 200) with a trench (e.g. the trench 204') therein; a liner layer (e.g. the liner layer 206) formed over a sidewall of the semiconductor substrate exposed by the trench; a seamless oxide layer (e.g. the seamless oxide layer 216) partially filling the trench, wherein the seamless oxide layer comprises an interior N-type or P-type doped region (e.g. the doped region 218) therein; and a cap oxide layer (e.g. the cap oxide layer 222) formed over the seamless oxide layer, filling the trench, wherein the cap oxide layer physically contacts the N-type or P-type doped region of the seamless oxide layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of seamless gap filling, comprising:
   providing a semiconductor structure with a device layer having a gap therein, wherein the gap has an aspect ratio greater than 4;
   forming a liner layer over the device layer exposed by the gap;
   forming a first un-doped oxide layer over the liner layer in the gap;
   forming a doped oxide layer over the first undoped oxide layer in the gap;
   forming a second un-doped oxide layer over the doped oxide layer in the gap, filling the gap; and
   performing an annealing process on the second un-doped oxide layer, the doped oxide layer, and the first un-doped oxide and forming a seamless oxide layer in the gap, wherein the seamless oxide layer has an interior doped region.

2. The method as claimed in claim 1, further comprising:
   removing a portion of the seamless oxide layer in the gap, leaving a reduced seamless oxide layer with a top surface below a top surface of device layer;
   forming a cap oxide layer over the reduced seamless oxide layer in the gap; and
   removing the liner layer and the cap oxide layer above the device layer.

3. The method as claimed in claim 1, wherein the device layer comprises dielectric materials or conductive materials.

4. The method as claimed in claim 1, wherein the gap has an aspect ratio of about 10~40.

5. The method as claimed in claim 1, wherein the first and second undoped oxide layers are formed by atomic layer depositions.

6. The method as claimed in claim 1, wherein the doped oxide layer is formed by atomic layer deposition incorporating precursors comprising N-type or P-type atoms.

7. The method as claimed in claim 1, wherein the annealing process is performed under nitrogen containing ambient.

8. The method as claimed in claim 2, wherein the cap oxide layer is formed by a plasma enhanced chemical vapor deposition, high density plasma chemical vapor deposition or spin on glass method.

9. A method for fabricating a shallow trench isolation (STI) structure, comprising:
   providing a semiconductor substrate, a pad layer over the semiconductor substrate, and a trench formed in the pad layer and the semiconductor trench, wherein the trench has an aspect ratio greater than 10;
   forming a liner layer over the semiconductor substrate and the pad layer exposed by the trench;
   forming a first un-doped oxide layer over the liner layer in the trench;
   forming a doped oxide layer over the first undoped oxide layer in the trench;
   forming a second un-doped oxide layer over the doped oxide layer in the trench and filling the trench; and
   performing an annealing process on the second un-doped oxide layer, the doped oxide layer, and the first un-doped oxide, forming a seamless oxide layer in the trench, wherein the seamless oxide layer has an interior doped region.

10. The method as claimed in claim 9, further comprising:
   removing a portion of the seamless oxide layer, leaving a reduced seamless oxide layer with a top surface below a top surface of the semiconductor substrate;
   forming a cap oxide layer over the reduced seamless oxide layer, filling the trench; and
   removing the pad layer, the liner layer and the cap oxide layer above the semiconductor substrate.

11. The method as claimed in claim 9, wherein the semiconductor substrate comprises silicon or silicon germanium.

12. The method as claimed in claim 9, wherein the trench has an aspect ratio of about 10~40.

13. The method as claimed in claim 9, wherein the first and second undoped oxide layers are formed by atomic layer deposition.

14. The method as claimed in claim 9, wherein the doped oxide layer is formed by atomic layer deposition incorporating precursors comprising N-type or P-type atoms.

15. The method as claimed in claim 9, wherein the annealing process is performed under nitrogen containing ambient.

16. The method as claimed in claim 10, wherein the cap oxide layer is formed by a plasma enhanced chemical vapor deposition, high density plasma chemical vapor deposition or spin on glass method.

* * * * *